(12) United States Patent
Lee et al.

(10) Patent No.: US 7,081,662 B1
(45) Date of Patent: Jul. 25, 2006

(54) ESD PROTECTION DEVICE FOR HIGH VOLTAGE

(75) Inventors: Jian-Hsing Lee, Hsin-Chu (TW); Yu-Chang Jong, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/199,833

(22) Filed: Aug. 9, 2005

(51) Int. Cl.
*H01L 29/00* (2006.01)
*H01L 29/73* (2006.01)

(52) U.S. Cl. .............................. 257/557; 257/E29.173
(58) Field of Classification Search ................. 257/557
See application file for complete search history.

(56) References Cited

U.S. PATENT DOCUMENTS

| | | |
|---|---|---|
| 5,872,379 A | 2/1999 | Lee |
| 6,066,879 A | 5/2000 | Lee et al. |
| 6,268,992 B1 | 7/2001 | Lee et al. |
| 6,274,443 B1 * | 8/2001 | Yu et al. ..................... 438/299 |
| 6,333,234 B1 | 12/2001 | Liu |
| 6,344,385 B1 * | 2/2002 | Jun et al. ..................... 438/237 |
| 6,459,127 B1 | 10/2002 | Lee et al. |
| 6,498,373 B1 * | 12/2002 | Vashchenko et al. ....... 257/360 |
| 6,552,399 B1 * | 4/2003 | Jun et al. .................... 257/357 |
| 6,734,054 B1 * | 5/2004 | Tang et al. ................. 438/197 |
| 6,869,840 B1 * | 3/2005 | Chatterjee et al. .......... 438/238 |

OTHER PUBLICATIONS

Lin, K.-H., et al., "Design on Latchup-Free Power-Rail ESD Clamp Circuit in HIgh-Voltage CMOS ICs," EOS/ESD Symposium, 2004, pp. 265-271.

* cited by examiner

*Primary Examiner*—Evan Pert
(74) *Attorney, Agent, or Firm*—Slater & Matsil, L.L.P.

(57) ABSTRACT

An electrostatic discharge (ESD) protection structure and a method for forming the same are provided. The structure includes a substrate having a buried layer, and a first and a second high-voltage well region on the buried layer. The first and second high-voltage well regions have opposite conductivity types and physically contact each other. The structure further includes a field region extending from the first high-voltage well region into the second high-voltage well region, a first doped region in the first high-voltage well region and physically contacting the field region, and a second doped region in the second high-voltage well region and physically contacting the field region. The first and second doped regions and the first high-voltage well region form a bipolar transistor that can protect an integrated circuit from ESD.

20 Claims, 9 Drawing Sheets

US 7,081,662 B1

ESD PROTECTION DEVICE FOR HIGH VOLTAGE

TECHNICAL FIELD

This invention relates generally to electrostatic discharge (ESD) protection devices, and more particularly to ESD protection devices protecting high voltage semiconductor devices and methods of forming the same.

BACKGROUND

It is well known that extremely high voltages can develop in the vicinity of an integrated circuit due to the build-up of static charge. A high potential may be generated to an input or output buffer of an integrated circuit, which may be caused by a person simply touching a package pin. When the electrostatic energy is discharged, a high current is produced through devices of the integrated circuit. Electrostatic discharge (ESD) is a serious problem for semiconductor devices, since it has the potential to destroy the device and the entire integrated circuit.

ESD protection devices are generally integrated into integrated circuits. An ESD protection device can provide a current path so that when an ESD transient occurs, the ESD current is conducted through the ESD protection device without going through the devices to be protected. High-voltage N-type metal-oxide-semiconductor (HVNMOS) devices are conventionally used as ESD protection devices, particularly for protecting high voltage semiconductor devices. FIG. 1 illustrates a conventional HVNMOS 2 that is used for ESD protection. The HVNMOS 2 includes a gate electrode 10, a gate dielectric 12, a drain region 4 in a high voltage N-well (HVNW) 16, and a source region 6 in a high voltage P-well (HVPW) 14. A shallow trench isolation (STI) region 8 isolates the drain region 4 and the gate electrode 10 so that high drain-gate voltage can be applied.

When used for ESD protection, the source region 6 is typically coupled to a power supply VSS, which is typically grounded, and the drain region 4 is coupled to an integrated circuit to be protected. If an electrostatic transient occurs and a reference voltage $V_{ref}$ at the drain region 4 increases, the HVNMOS 2 is turned on and the ESD current flows from the drain region 4 to the source region 6, so that the integrated circuit coupled to the drain region 4 is protected.

The ESD protection device formed by a HVNMOS 2 suffers drawbacks, however. The gate dielectric 12 traps charges when ESD occurs. Since HVNMOS transistors are commonly used under high operational voltage, the resulting high electric field leads to the incurrence of hot electrons around the junction of the channel and drain region. These hot electrons affect covalent electrons around the drain region by producing electron-hole pairs through the lifting of the electrons around the drain to conductive bands. When electrons travel between drain region 4 and source region 6, a small portion of the electrons are injected into and become trapped in the gate dielectric 12. Trapped charges cause the gate dielectric 12 to degrade. As a result, the HVNMOS's leakage current increases and breakdown voltage decreases. The HVNMOS may eventually fail when the maximum voltage it can sustain is lower than the electrostatic voltages.

SUMMARY OF THE INVENTION

The preferred embodiments of the present invention provide an electrostatic discharge (ESD) protection structure protecting high voltage semiconductor devices and a method for forming the same.

In accordance with one preferred embodiment of the present invention, the structure includes a substrate having an overlying buried layer, and a first and a second high-voltage well region on the buried layer. The first and second high-voltage well regions have opposite conductivity types and are physically in contact with each other. A field region extends from the first high-voltage well region into the second high-voltage well region. The field region is preferably a shallow trench isolation region or a field oxide. The structure further includes a first doped region in the first high-voltage well region and physically contacting the field region, and a second doped region in the second high-voltage well region and physically contacting the field region. The first and second doped regions have an opposite conductivity type as the first high-voltage well region.

In accordance with another preferred embodiment of the present invention, the structure further includes a third doped region in the first high-voltage well region. The first and third doped regions may be separated by a field region, spaced apart, or be formed next to each other. The third doped region has a same conductivity type as the first high-voltage well region.

In accordance with yet another preferred embodiment of the present invention, the first high-voltage well region is a P-well region, and the second high-voltage well region is an N-well region. The first and second doped regions are N+ regions, and the third doped region is a P+ region.

The first and second doped regions and the first and second high-voltage well regions form a bipolar transistor that can protect an integrated circuit from electrostatic discharge.

In accordance with yet another preferred embodiment of the present invention, a method for forming the ESD protection structure includes providing a substrate of a first conductivity type, forming a buried layer of an opposite conductivity type than the substrate in a top region of the substrate, and forming a doped semiconductor layer having the same conductivity type as the substrate over the buried layer. By masking a sub region of the doped semiconductor layer, impurities having an opposite conductivity type as the doped semiconductor layer are implanted. After the implantation, the sub region forms a first high-voltage well region, and the implanted region forms a second high-voltage well region. The method further includes forming a first field region extending from the first high-voltage well region to the second high-voltage well region, forming a first doped region in the first high-voltage well region and physically contacting the field region, and a second doped region in the second high-voltage well region and physically contacting the field region, wherein the first and second doped regions have the same conductivity type as the second high-voltage well region.

In accordance with yet another preferred embodiment of the present invention, a method of protecting an integrated circuit using the ESD protection structure includes coupling a power supply node, preferably VSS and more preferably grounded, to the first doped region, and coupling a reference node to the second doped region, wherein the reference node is electrically coupled to an integrated circuit to be protected. When an electrostatic discharge occurs at the reference node, the ESD protection structure conducts the ESD current and lowers the reference voltage at the reference node.

Since the gate dielectric, which traps charges and is prone to damages caused by ESD stress, is removed, the reliability of the preferred embodiments of the present invention is improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Preferred embodiments of the present invention are described with reference to FIGS. 2 through 9. Throughout the various views and illustrative embodiments of the present invention, like reference numbers are used to designate like elements.

Figure 1:
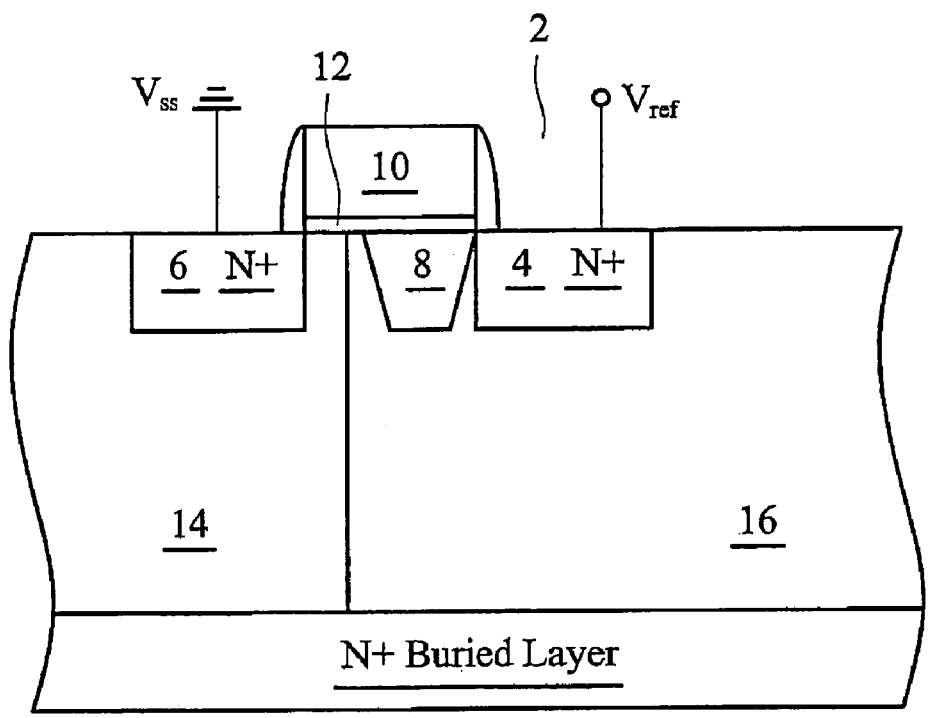
FIG. 1 illustrates a conventional high voltage NMOS device that is used as an electrostatic discharge protection device.
Figure 2:
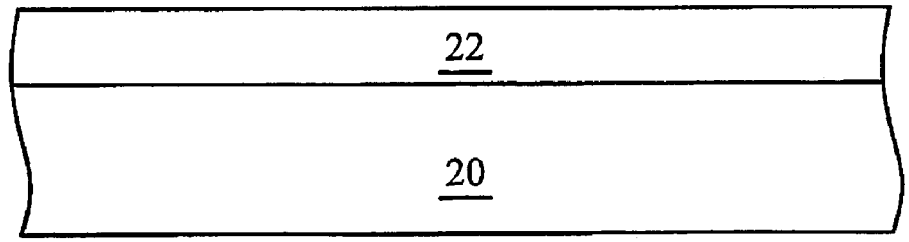
FIGS. 2 through 9 are cross-sectional views of intermediate stages in the manufacture of preferred embodiments of the present invention.

Referring to FIG. 2, a substrate 20 is provided. The substrate 20 preferably comprises a semiconductor material such as silicon, although other semiconductor materials may be used. The substrate 20 is preferably P-type. Alternatively, the substrate 20 can comprise an N-type substrate.

An N+ buried layer (NBL) 22 is formed in a top region of the substrate 20 proximate the substrate 20 top surface. The NBL 22 is preferably formed by implanting dopants into the top surface of the substrate 20. For example, antimony and/or arsenic may be implanted to a dopant concentration of about $10^{16}/cm^3$ to $10^{18}/cm^3$. The dopant of the NBL 22 may then be driven into a top region of the substrate 20 by heating the substrate 20 to a temperature of about 1000° C. to about 1100° C. In alternative embodiments, if the substrate 20 is N-type, a P+ buried layer will be formed instead. The NBL 22 acts as an electrical isolation region, isolating the devices subsequently formed over the NBL 22 from the substrate 20.

Figure 3:
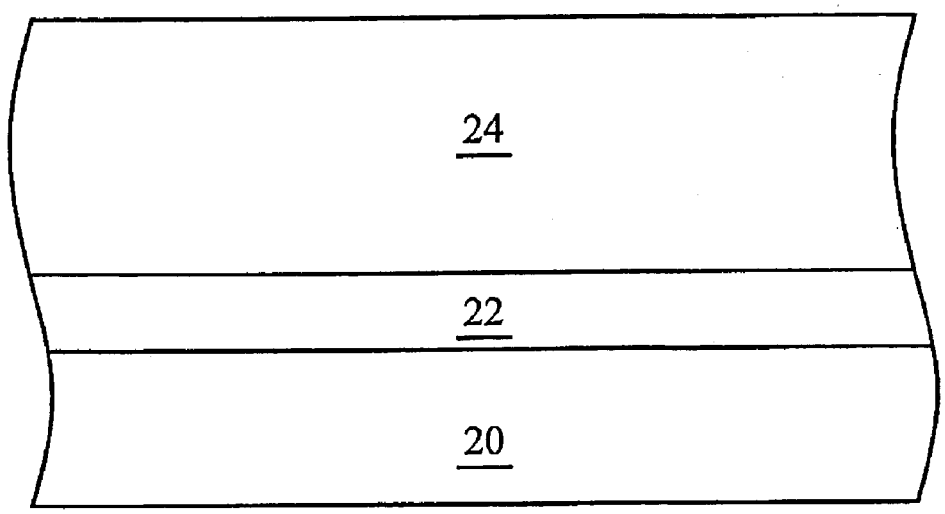

FIG. 3 illustrates a doped semiconductor layer 24 deposited over the NBL 22. The doped semiconductor layer 24 preferably comprises a semiconductor such as silicon, and is preferably doped with a P-type impurity. The doped semiconductor layer 24 is preferably epitaxially grown, and is alternatively referred to as P-epi layer 24, although other deposition methods may alternatively be used. While epitaxially growing the semiconductor layer 24, P-type dopants such as boron are introduced, preferably to a concentration of between about $10^{15}/cm^3$ and about $10^{16}/cm^3$.

Figure 4:
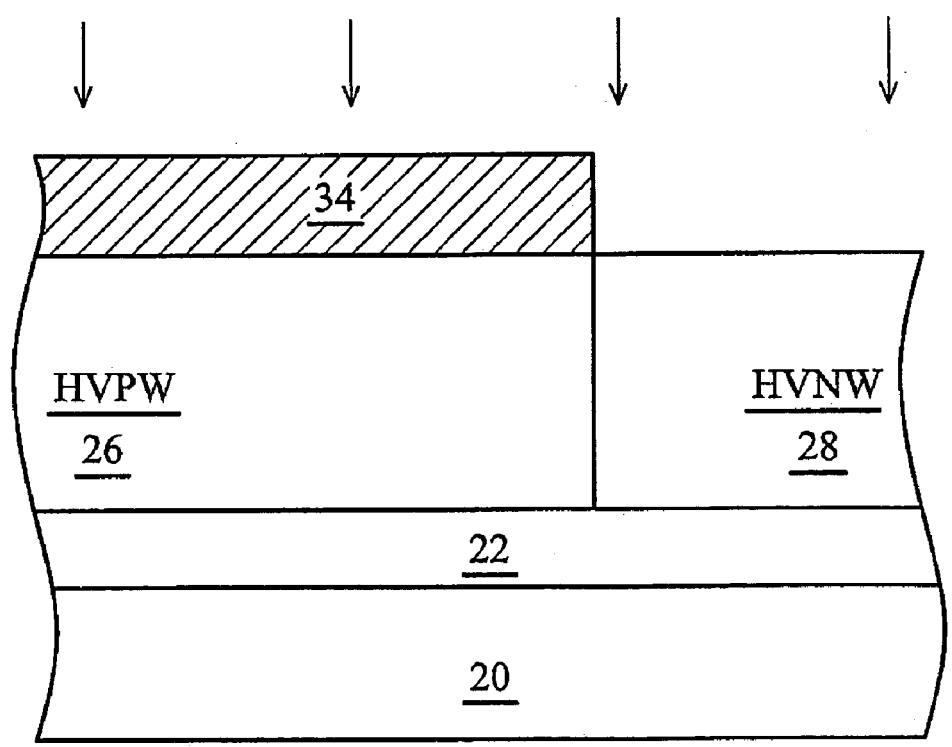

A photo resist 34 is formed, as shown in FIG. 4. The photo resist 34 is patterned using lithography techniques. An N-type impurity implantation is then performed in order to form an N-well region 28, also equally referred to as high-voltage N-well (HVNW) region 28. The HVNW region 28 preferably comprises antimony and/or arsenic, which neutralizes the P-type impurities in the P-epi layer 24 and converts the implanted region to N-type. After the implanting, the HVNW region 28 preferably has a net N-type impurity concentration of between about $10^{15}/cm^3$ and about $10^{16}/cm^3$. Preferably, the bottom of the HVNW region 28 reaches the NBL 22, although a shallower HVNW region 28 may be formed. Due to the masking by the photo resist 34, a portion of the P-epi layer 24 (refer to FIG. 3) that is masked forms a P-well region 26, which is equally referred to as high-voltage P-well (HVPW region) 26. The photo resist 34 is then removed.

Figure 5A:
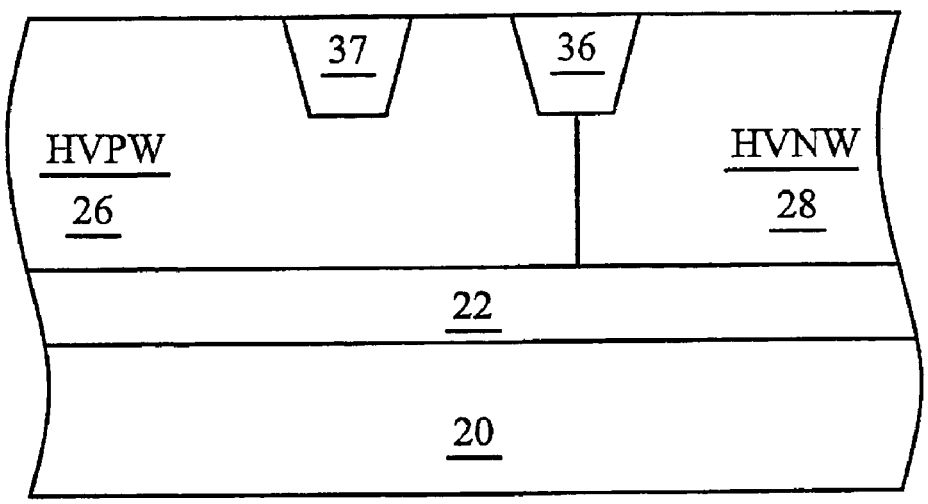
Figure 5B:
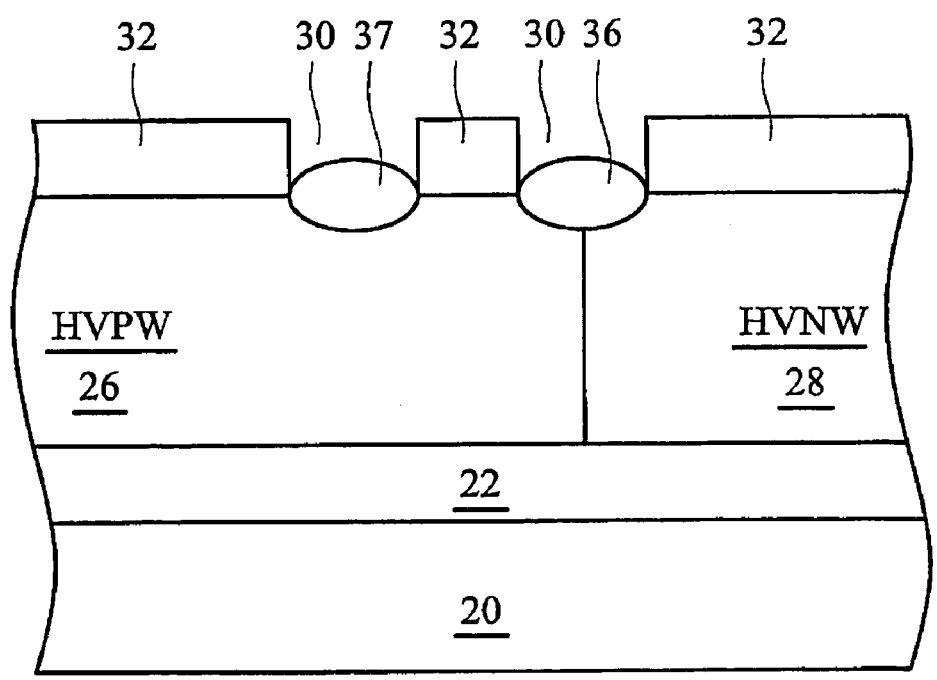

FIGS. 5A and 5B illustrate the formation of field regions 36 and 37, wherein field region 36 extends from the HVPW region 26 into the HVNW region 28, and field region 37 is formed in the HVPW region 26. In the preferred embodiment, as shown in FIG. 5A, the field regions 36 and 37 are formed by making trenches in the P-epi layer 24 (refer to FIG. 3), filling the trenches with a dielectric material, such as $SiO_2$ or HDP oxide, and performing a chemical mechanical polish to level the surface. The resulting shallow trench isolation (STI) regions are the field regions. In other embodiments, as shown in FIG. 5B, a mask layer 32, preferably formed of SiN, is formed over the P-epi layer 24 (refer to FIG. 3). The mask layer 32 is then patterned, forming openings 30. An oxidation is then performed, and the field regions (also referred to as field oxides) 36 and 37 are formed through the openings 30. Typically, for 0.25 μm technology and under, field regions are preferably STI regions. For technologies with greater scale, field regions are preferably field oxides.

Figure 6:
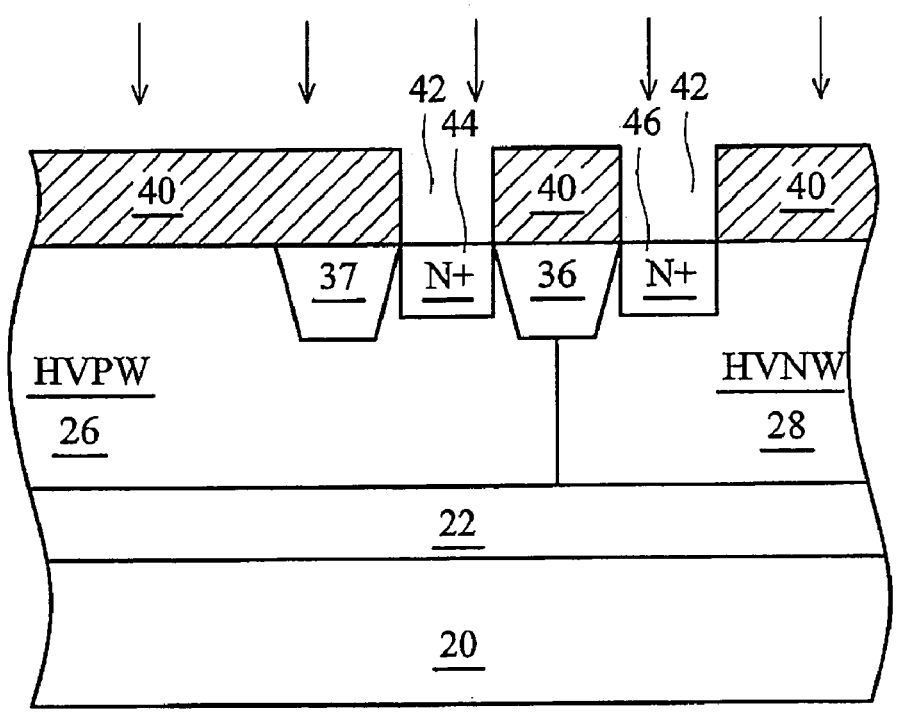

After the removal of the mask layer 32, another photo resist layer 40 is deposited over the wafer and patterned, forming openings 42, as shown in FIG. 6. An N-type dopant implantation is performed through the openings 42, forming an N+ region 44 in the HVPW region 26 and an N+region 46 in the HVNW region 28. Preferably, the impurity introduced by the N+ dopant implant comprises phosphorus and/or arsenic, and is heavily doped to a concentration of greater than about $10^{20}/cm^3$. In the described embodiments, heavily doped means an impurity concentration of above about $10^{20}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. The N+ region 44 occupies the space between the field regions 36 and 37 and physically contacts the field regions 36 and 37. The N+ region 46 physically contacts the field region 36. One skilled in the art will realize that although the N+ regions 44 and 46 have the same conductivity type, they may comprise different impurities and/or have different impurity concentrations. The N+ regions 44 and 46 can also be formed separately.

Figure 7:
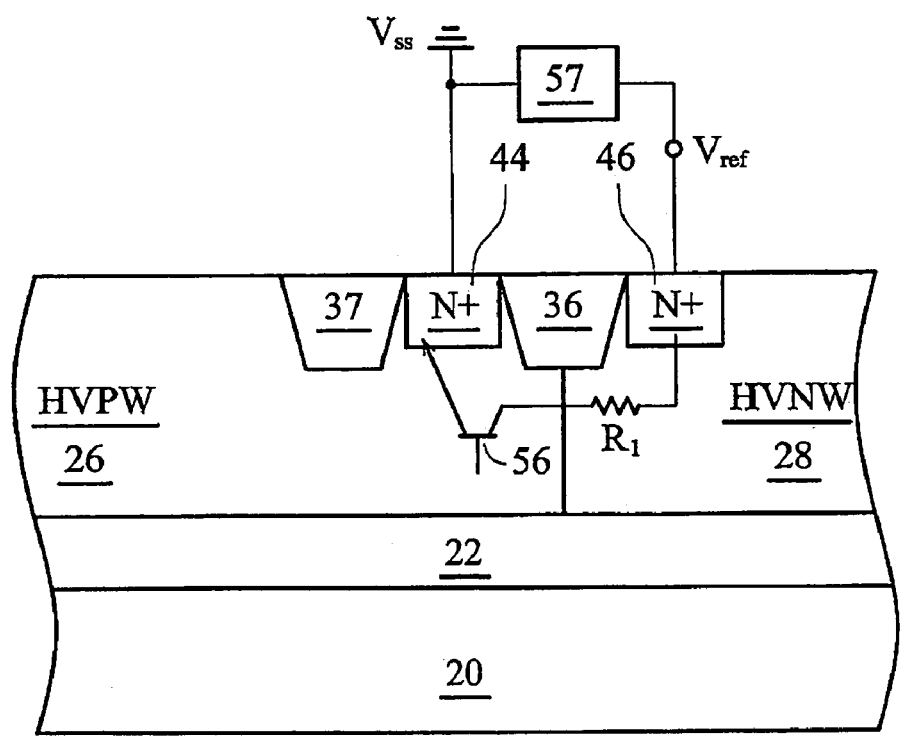

The photo resist 40 is removed, and a resulting NPN structure, which can be symbolized by an equivalent NPN bipolar transistor 56, is shown in FIG. 7. The bipolar NPN transistor 56 has an emitter 44 (N), a base 26 (P), and a collector 28(N). A resistor $R_1$ symbolizes the parasitic resistance in the HVNW region 28.

When used as an ESD protection device, the N+ region 44 is typically coupled to a power supply node, preferably VSS and more preferably grounded, and the N+ region 46 is coupled to a reference node of an integrated circuit 57 to be protected. The integrated circuit 57 is preferably coupled between the nodes 44 and 46. The N+ region 46 has a reference voltage $V_{ref}$. When an ESD surge occurs and the reference voltage $V_{ref}$ rises above a breakdown voltage, for example, at around 40 volts, the collector-base junction breaks down. The generated holes are injected into the base (HVPW region 26) and cause its potential to rise, forward biasing the base-emitter junction, and causing the NPN transistor 56 to turn on. An ESD current therefore flows through the bipolar transistor 56, lowering the reference potential voltage $V_{ref}$, and protecting the integrated circuit 57 that is coupled to the N+ region 46.

Figure 8:
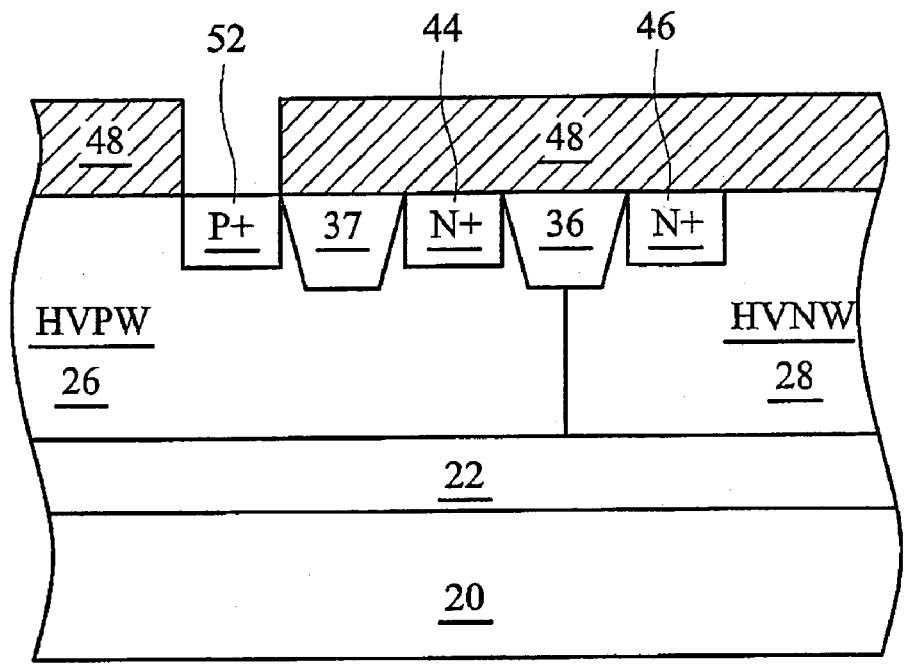

The preferred embodiment of the present invention may further include a P+ region 52 in the HVPW region 26, as illustrated in FIG. 8. In order to form the P+ region 52, a photo resist layer 48 is deposited, patterned and developed. The photo resist 48 is used as a mask while the P+ region 52 is formed by doping the top surface of a portion of the HVPW region 26 with a P-type dopant such as boron. The P+ region 52 is preferably heavily doped to a dopant concentration of greater than about $10^{20}/cm^3$. The P+ region 52 preferably contacts the STI region 37, although a space may exist therebetween. One skilled in the art will realize that the order of forming N+ regions and P+ regions is a matter of mere design choice.

Figure 9:
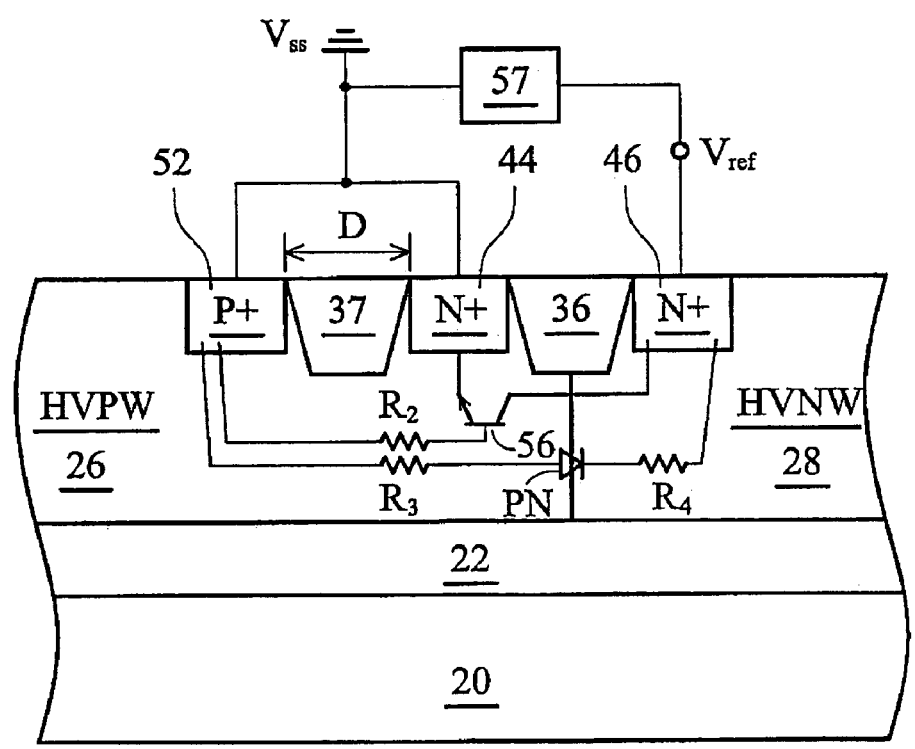

Referring to FIG. 9, the P+ region 52 is used as a contact region so that the correct potential of the VSS can be applied to the HVPW region 26. Preferably, the P+ region 52 and N+ region 44 are interconnected, for example, by a conductive line formed in a metal layer. An equivalent circuit diagram is also shown in FIG. 9, wherein besides the NPN transistor 56, an additional parasitic resistor $R_2$ represents the parasitic resistance in the HVPW region 26. The parasitic resistor $R_2$ is partially determined by the width D of the field region 37. In the preferred embodiment, the P+ region 52 is separated from the N+ region 44 by the field region 37. In other embodiments, the P+ region 52 can be adjacent the N+ region 44, or spaced apart from the N+ region 44 with no field region therebetween.

The preferred embodiment of the present invention also provides ESD protection for an ESD current in a reversed direction. The HVPW region 26 and HVNW region 28 form a P-N diode PN. The parasitic resistances in the HVPW region 26 and HVNW region 28 are represented by resistors $R_3$ and $R_4$, respectively. If an electrostatic transient occurs and the reference voltage $V_{ref}$ decreases, an ESD current flows through the path formed by the diode PN and resistors $R_3$ and $R_4$. Therefore, the preferred embodiments of the present invention can protect high voltage semiconductor circuits 57 from electrostatic discharge in both directions.

Figure 10:
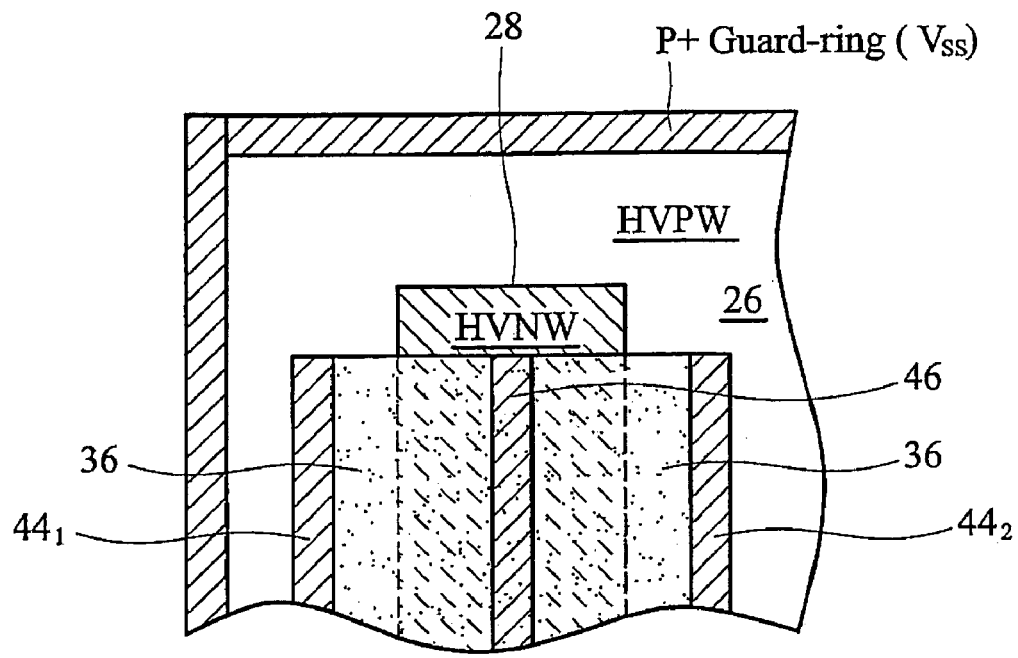
FIGS. 10 and 11 are exemplary layouts of the preferred embodiments of the present invention.
Figure 11:
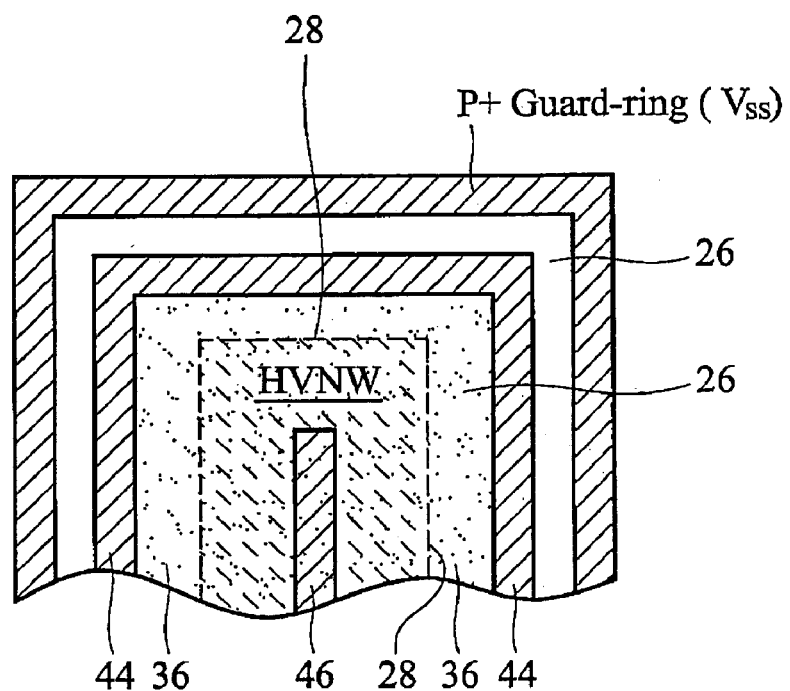

FIGS. 10 and 11 are exemplary layouts of the preferred embodiments of the present invention. In FIG. 10, the N+ region 44 comprises two portions $44_1$ and $44_2$, which are interconnected, in order to increase the area. In FIG. 11, the N+ region 44 encloses the N+ region 46, HVNW region 28 and field region 36 to maximize the area. Please note that the field region 36 overlaps the HVNW region 28 and HVPW region 26.

Figure 12A:
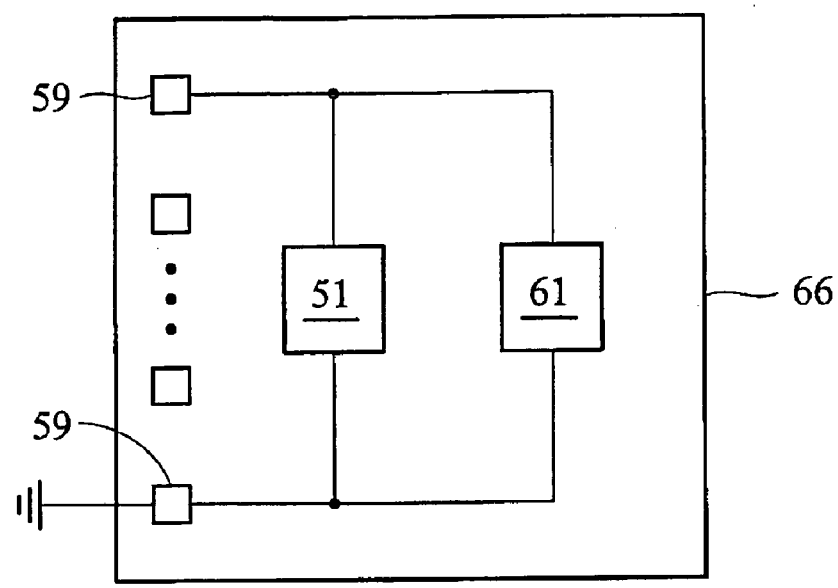
FIGS. 12A and 12B illustrate exemplary protection schemes at chip and package levels, respectively.
Figure 12B:
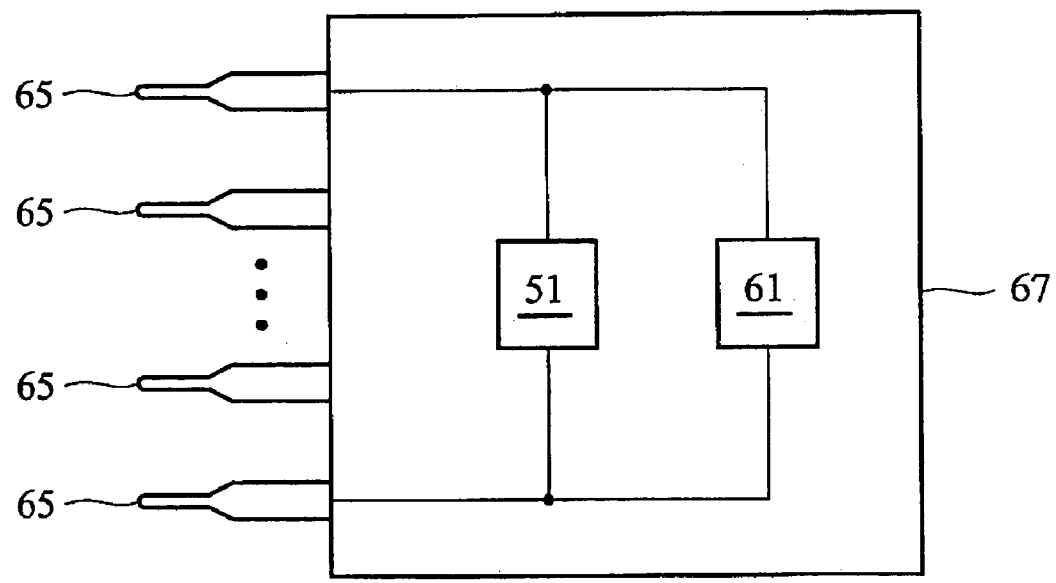

The preferred embodiments of the present invention may be used for circuit level protection, as previously discussed using FIGS. 7 and 9, or for chip level, and even package level protections. FIG. 12A illustrates a chip level protection scheme. An integrated circuit 51 is coupled between (input/output) I/O pads 59 of a chip 66. If an ESD transient occurs between the I/O pads 59, an NPN ESD protection device 61 conducts the ESD current, and the integrated circuit 51 and other integrated circuits (not shown) coupled between the I/O pads 59 are protected. FIG. 12B illustrates a similar protection scheme at the package level. The NPN ESD protection device 61 is electrically coupled to the I/O pins 65 of a package 67, providing package level protection to the circuit 51.

Although the preferred embodiments provide a method of forming NPN ESD protection devices, one skilled in the art will realize that the teaching provided is readily available for the formation of PNP ESD protection devices, with the types of the respective high voltage well regions, doped regions, buried layer and substrate inverted.

Figure 13:
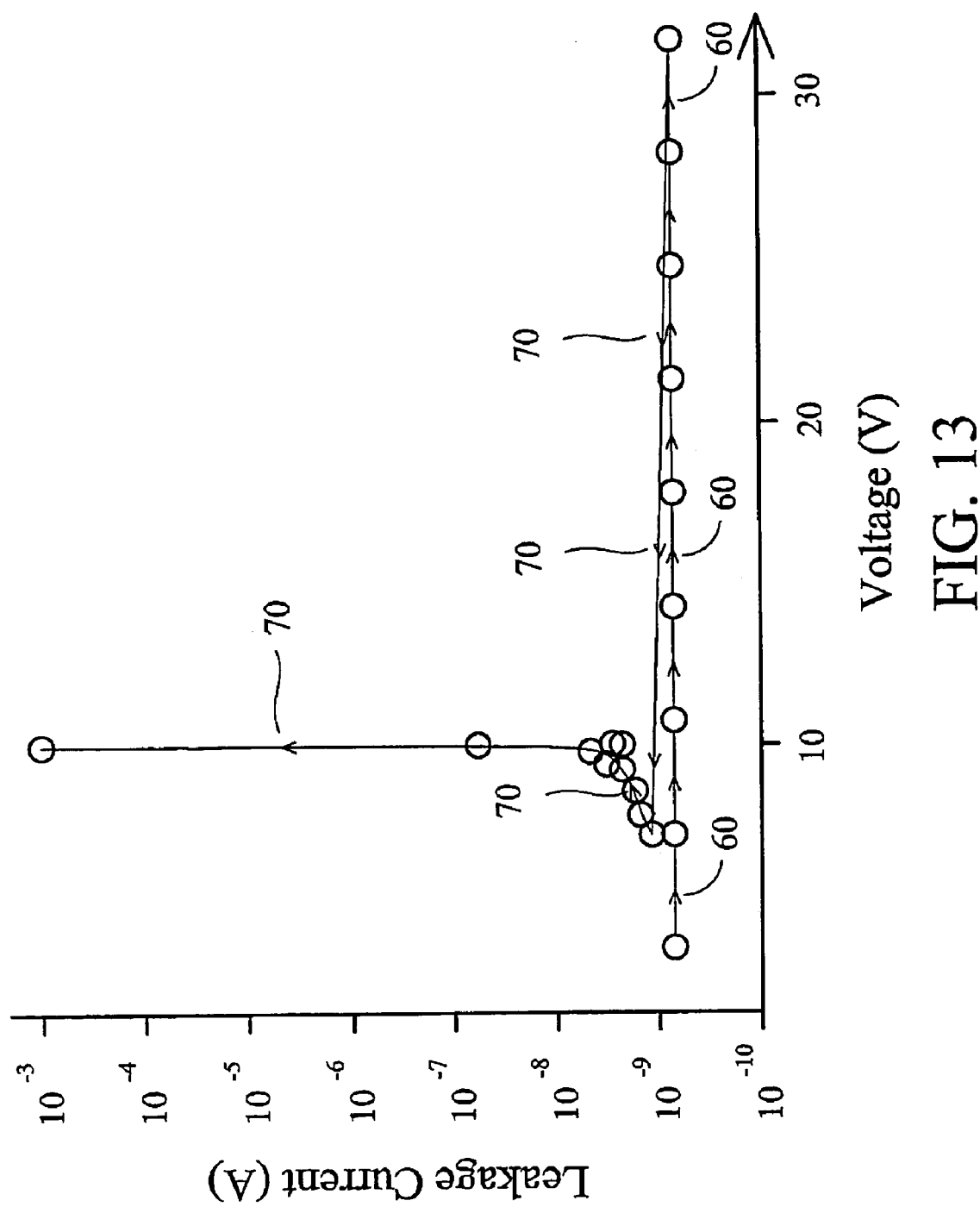
FIG. 13 illustrates experiment results of a conventional high voltage NMOS device, wherein the leakage current is increased after each ESD stress that activates the HVNMOS.
Figure 14:
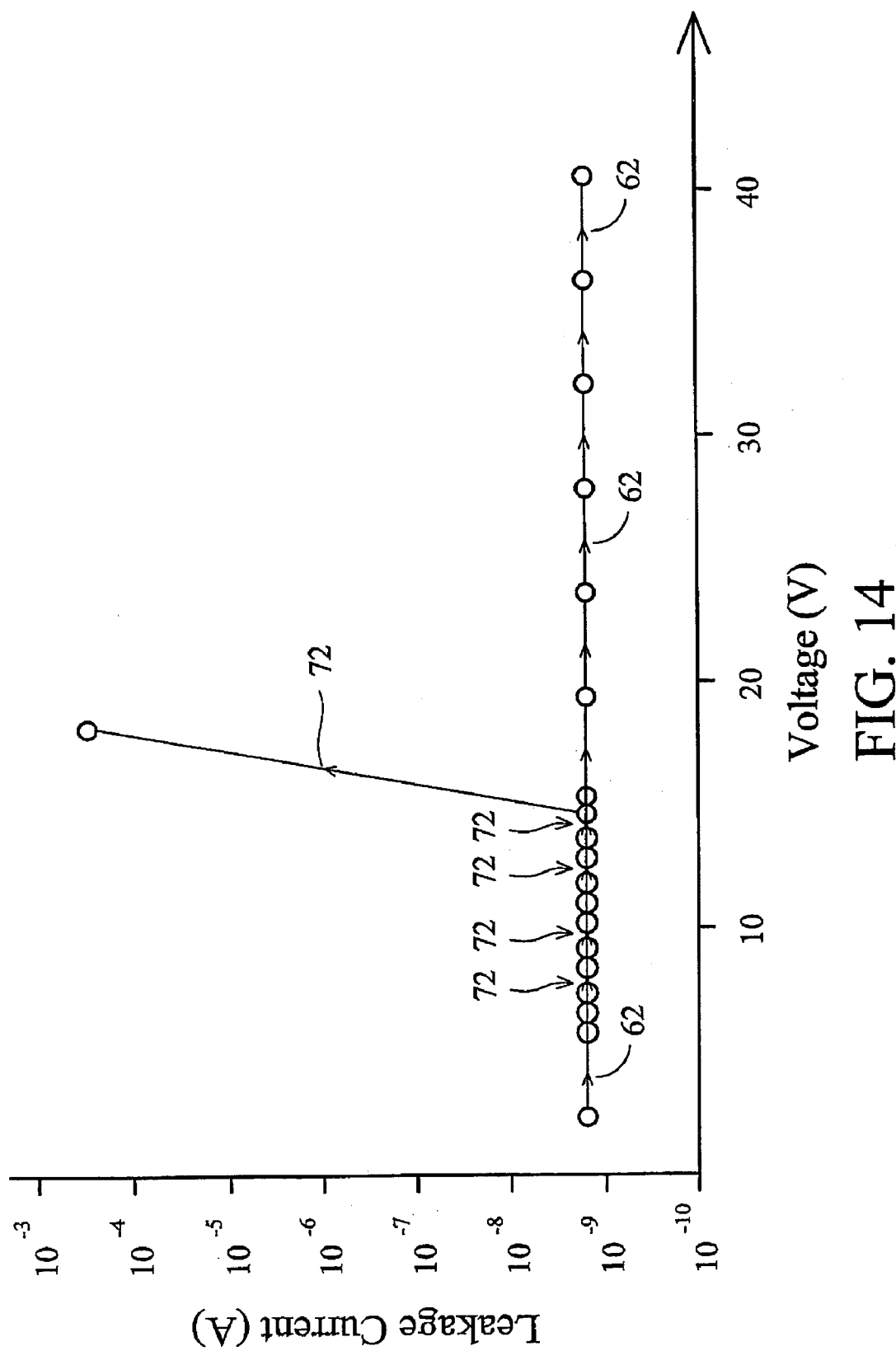
FIG. 14 illustrates experiment results of the preferred embodiments of the present invention, wherein the leakage current does not increase after each ESD stress that activates the NPN transistor.

The effects of the preferred embodiments of the present invention are shown in FIGS. 13 and 14. FIG. 13 illustrates leakage current of a conventional sample HVNMOS device as a function of reference voltage applied. Each circle indicates a voltage stress, which is performed by applying a reference voltage between the drain region and the source region. Therefore, each circle represents an ESD stress. In the directions of arrows 60, the reference voltage increases. It is noted that when the reference voltages are less than about 33 volts, the leakage current stays the same at around $8 \times 10^{-9}$ amps. When the reference voltages are greater than about 33 volts, the HVNMOS is turned on and the voltage-drop between the drain region and source region snaps back to about 6 volts. The leakage current, as shown as circles connected by arrows 70, meanwhile, increases, and continues to increase after each stress. This indicates that the HVNMOS sample devices degrade after each ESD stress.

FIG. 14 illustrates leakage current of the preferred embodiments of the present invention as a function of reference voltages applied. Similarly, each circle indicates a voltage stress, which is performed by applying a reference voltage on the doped region 46. In the direction of arrows 62, the reference voltage increases. It is noted that when the reference voltages are less than about 40 volts, the leakage current stays the same at around $1.1 \times 10^{-9}$ amps. When the reference voltages are greater than about 40 volts, the NPN transistor is turned on and the voltage-drop between doped regions 46 and 44 decreases. The leakage currents, as shown as circles connected by arrows 72, however, stay the same after each voltage stress with an increase in current, until finally the sample device is damaged when a very high current flows through the sample device. The relatively constant leakage currents indicate that the preferred embodiments of the present invention do not degrade when stressed by ESD.

Experiments have also revealed that the preferred embodiments of the present invention can work for similar forward and reverse mode ESD voltages at both machine mode and human body mode.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrostatic discharge (ESD) protection structure comprising:
    a substrate;
    a buried layer in the substrate;
    a first high-voltage well region overlying the buried layer;
    a second high-voltage well region overlying the buried layer and physically contacting the first high-voltage well region, the first and second high-voltage well regions having opposite conductivity types;
    a first field region extending from within the first high-voltage well region into the second high-voltage well region;
    a first doped region in the first high-voltage well region and physically contacting the first field region; and
    a second doped region in the second high-voltage well region and physically contacting the first field region, wherein the first and second doped regions are respectively heavily doped with an impurity of a same conductivity type as the second high-voltage well region.

2. The structure of claim 1 wherein the first high-voltage well region and the substrate are of P-type, and the second high-voltage well region, the buried layer, and the first and second doped regions are of N-type.

3. The structure of claim 1 wherein the first field region is a shallow trench isolation.

4. The structure of claim 1 wherein the first field region is a field oxide.

5. The structure of claim 1 further comprising a third doped region in the first high-voltage well region, wherein the third doped region has a same conductivity type as the first high-voltage well region, and wherein the first doped region and the third doped region are electrically connected.

6. The structure of claim 5 further comprising a second field region between and physically contacting the first doped region and the third doped region, respectively.

7. The structure of claim 1 wherein the first and second doped regions each has a dopant concentration of greater than about $10^{20}/cm^3$.

8. The structure of claim 1 wherein the buried layer has a dopant concentration of between about $10^{16}/cm^3$ and about $10^{18}/cm^3$.

9. The structure of claim 1 wherein the first and second high-voltage well regions each have a dopant concentration of between about $10^{15}/cm^3$ and about $10^{16}/cm^3$.

10. The structure of claim 1 further comprising:
    a power supply node electrically coupled to the first doped region; and
    a reference node electrically coupled to the second doped region, wherein the reference node is electrically coupled to a circuit susceptible to electrostatic discharge damage.

11. The structure of claim 10 wherein the power supply node is grounded.

12. The structure of claim 1 wherein the structure is in a semiconductor chip, and wherein the first and the second doped regions are electrically coupled to input/output pads of the semiconductor chip.

13. The structure of claim 1 wherein the structure is packaged in a package, and wherein the first and the second doped regions are electrically coupled to input/output pins of the package.

14. An ESD protection structure comprising:
    an NPN bipolar transistor comprising:
        a base formed of a high-voltage well region of P-type;
        an emitter in the base, the emitter being heavily doped with an N-type impurity; and
        a collector formed of a high-voltage well region of N-type physically contacting the base;
    a heavily doped N-type region in the high-voltage well region of N-type, wherein the emitter and the heavily doped N-type region are separated by and physically contacting a first field region;
    a N+ buried layer underlying the NPN bipolar transistor; and
    a P-type substrate underlying the N+ buried layer.

15. The ESD protection structure of claim 14 further comprising a heavily doped P-type region and a second field region in the high-voltage well region of P-type, wherein the heavily doped P-type region and the emitter are separated by the second field region.

16. The ESD protection structure of claim 14 further comprising:
    a power supply node electrically coupled to the emitter; and
    a reference node electrically coupled to the collector, wherein the reference node is electrically coupled to a circuit susceptible to electrostatic discharge damage.

17. The ESD protection structure of claim 16 wherein the power supply node is grounded.

18. A semiconductor chip comprising:
    an NPN bipolar transistor comprising:
        a base formed of a first high-voltage well region of P-type;
        an emitter in the base, the emitter being heavily doped with an N-type impurity; and
        a collector formed of a second high-voltage well region of N-type physically contacting the base;
    a heavily doped N-type region in the second high-voltage well region, wherein the emitter and the heavily doped N-type region are separated by and physically contacting a first field region;
    a heavily doped P-type region and a second field region in the first high-voltage well region, wherein the heavily doped P-type region and the emitter are separated by the second field region;
    a first contact pad electrically coupled to the heavily doped P-type region and the emitter;
    a second contact pad electrically coupled to the heavily doped N-type region;
    a N+ buried layer underlying the NPN bipolar transistor; and
    a P-type substrate underlying the N+ buried layer.

19. The semiconductor chip of claim 18 further comprising an integrated circuit electrically coupled between the first contact pad and the second contact pad.

20. The semiconductor chip of claim 18 wherein the first contact pad is electrically coupled to a power voltage supply.

* * * * *